(12) United States Patent
Wang et al.

(10) Patent No.: US 11,031,948 B1
(45) Date of Patent: Jun. 8, 2021

(54) DIAGNOSTIC SYSTEM

(71) Applicant: Baker Hughes Oilfield Operations LLC, Houston, TX (US)

(72) Inventors: Lifeng Wang, Shanghai (CN); Hao Wang, Shanghai (CN); Zhili Zhou, Shanghai (CN); Xiaoyan Huang, Shanghai (CN); Ran Ao, Shanghai (CN)

(73) Assignee: BAKER HUGHES OILFIELD OPERATIONS LLC, Houston, TX (US)

( * ) Notice: Subject to any disclaimer, the term of this patent is extended or adjusted under 35 U.S.C. 154(b) by 0 days.

(21) Appl. No.: 17/034,738

(22) Filed: Sep. 28, 2020

(51) Int. Cl.
*H03M 1/68* (2006.01)
*H03M 1/74* (2006.01)
*H03M 1/70* (2006.01)

(52) U.S. Cl.
CPC .............. *H03M 1/68* (2013.01); *H03M 1/70* (2013.01); *H03M 1/747* (2013.01)

(58) Field of Classification Search
CPC ........... H03M 1/68; H03M 1/70; H03M 1/747
See application file for complete search history.

(56) References Cited

U.S. PATENT DOCUMENTS 7,598,754 B2 * 10/2009 Yu .......................... H02H 3/335
  324/713
9,217,786 B2 * 12/2015 Delcol .................. F02D 41/009

\* cited by examiner

*Primary Examiner* — Brian K Young
(74) *Attorney, Agent, or Firm* — Mintz Levin Cohn Ferris Glovsky and Popeo, PC; Lisa Adams

(57) ABSTRACT

A diagnostic system includes a detection circuit comprising a first impedance, a second impedance, a first input pin, a second input pin, a first output pin and a second output pin. The detection circuit is configured to receive an input signal via the first and the second input pins. The first impedance is configured to electrically couple the first input pin and the first output pin, and the second impedance is configured to electrically couple the first input pin with the second input pin and second output pin. The diagnostic system also includes a communication channel. The diagnostic system further includes an input circuit comprising a third input pin, a fourth input pin and a third output pin. The input circuit is configured to provide, via the third output pin, a voltage signal.

21 Claims, 4 Drawing Sheets

DIAGNOSTIC SYSTEM

BACKGROUND

In industrial systems, sensors can be used to detect one or more properties (e.g., vibration, rotational frequency, temperature, etc.) of industrial machines. The detected properties can be transmitted in the form of an electrical signal over a communication channel (e.g., wires, cables, transmission lines, etc.). Data characterizing the detected properties can be received by a diagnostic system that can analyze the data, and make determinations about properties of the industrial machine, the sensor, etc.

SUMMARY

In one implementation, diagnostic system includes a detection circuit comprising a first impedance, a second impedance, a first input pin, a second input pin, a first output pin and a second output pin. The detection circuit is configured to receive an input signal via the first and the second input pins. The first impedance is configured to electrically couple the first input pin and the first output pin, and the second impedance is configured to electrically couple the first input pin with the second input pin and second output pin. The diagnostic system also includes a communication channel. The diagnostic system further includes an input circuit comprising a third input pin, a fourth input pin and a third output pin. The communication channel electrically couples the first output pin with the third input pin, and electrically couples the second output pin with the fourth input pin. The input circuit is configured to provide, via the third output pin, a voltage signal. A first value of the voltage signal is indicative of a first state of the communication channel, and a second value of the voltage signal is indicative of a second state of the communication channel.

One or more of the following features can be included in any feasible combination.

In one implementation, a third value of the voltage signal is indicative of a first state of an input source and a fourth value of the voltage signal is indicative of a second state of the input source, wherein the input source is configured to electrically couple to the first and the second input pins of the detection system, and generate the input signal. In another implementation, the input circuit further includes a voltage source, a third impedance and a fourth impedance. The third impedance electrically couples the voltage source with the third input pin, and the fourth impedance electrically couples the third impedance and the third input pin with the third output pin.

In one implementation, the method further includes a diagnostic circuit including a first comparator comprising a first comparator input pin, a second comparator input pin and a first comparator output pin. The first comparator input pin is electrically coupled to the third output pin of the input circuit, and the second comparator input pin is configured to receive a first reference signal. The first reference signal can be provided by a digital-to-analog converter (DAC). The first reference signal has a first voltage value during a first time period, a second voltage value during a second time period, and a third voltage value during a third time period.

In one implementation, the first comparator is configured to provide a first output signal during the first time period, a second output signal during a second time period and a third output signal during the third time period. The first, the second and the third output signals have one of a first output state and a second output state. The second output state is at a higher potential than the first output state. In another implementation, the diagnostic circuit includes a second comparator comprising a third comparator input pin, a fourth comparator input pin and a second comparator output pin. The third comparator input pin is electrically coupled to the third output pin of the input circuit, and wherein the fourth comparator input pin is configured to receive a second reference signal.

In one implementation, the diagnostic circuit includes a third comparator comprising a fifth comparator input pin, a sixth comparator input pin and a third comparator output pin. The fifth comparator input pin is electrically coupled to the third output pin of the input circuit, and wherein the sixth comparator input pin is configured to receive a third reference signal. In another implementation, the first comparator is configured to provide a first output signal via the first comparator output pin, the second comparator is configured to provide a second output signal via the second comparator output pin, and the third comparator is configured to provide a third output signal via the third comparator output pin.

In one implementation, the first output signal, the second output signal and the third output signal have one of a first output state and a second output state. The second output state is at a higher potential than the first output state. In one implementation, a diagnostic signal includes the first output signal, the second output signal and the third output signal. In another implementation, the diagnostic signal is indicative of the first state of the communication channel. The first output signal has the first output state, the second output signal has the first output state and the third output signal has the first output state.

In one implementation, the first state of the communication channel is indicative of an extraneous electrical coupling between a first communication channel impedance and a second communication channel impedance in the communication channel. In another implementation, the diagnostic signal is indicative of the second state of the communication channel. The first output signal has the second output state, the second output signal has the second output state and the third output signal has the second output state. In one implementation, the second state of the communication channel is indicative of a disruption in electrical coupling between the detection circuit and the input circuit.

In one implementation, the diagnostic signal is indicative of the first state of the input source, wherein the first output signal has the second output state, the second output signal has the first output state and the third output signal has the first output state. In another implementation, the first state of the input source is indicative that the input source is in a switched-on mode. In one implementation, the diagnostic signal is indicative of the second state of the input source, wherein the first output signal has the second output state, the second output signal has the second output state and the third output signal has the first output state. In one implementation, the second state of the input source is indicative that the input source is turned off. In one implementation, the fourth input pin is electrically coupled to a ground potential, and the third output pin is electrically coupled to the ground potential via a capacitor.

In one implementation, a method includes receiving an input signal via a first and a second input pins of a detection circuit. The detection circuit includes a first impedance, a second impedance, the first input pin, the second input pin, a first output pin and a second output pin. The first impedance is configured to electrically couple the first input pin and the first output pin, and the second impedance is configured to electrically couple the first input pin with the second input pin and second output pin. The method also includes receiving, by a third input pin and a fourth input pin of an input circuit, an output signal from the detection circuit via a communication channel or from a communication channel electrically coupled to the third input pin and the fourth input pin. The method further includes providing a voltage signal via a third output pin of the input circuit. A first value of the voltage signal is indicative of a first state of the communication channel, and a second value of the voltage signal is indicative of a second state of the communication channel.

These and other capabilities of the disclosed subject matter will be more fully understood after a review of the following figures, detailed description, and claims.

BRIEF DESCRIPTION OF THE FIGURES

These and other features will be more readily understood from the following detailed description taken in conjunction with the accompanying drawings, in which.

DETAILED DESCRIPTION

A sensor coupled to industrial machines (e.g., turbines) can detect various properties of the industrial machines (e.g., vibration, temperature, motor frequency, and the like). The sensor can transmit detection signals (e.g., electrical signals) over a communication channel (e.g., electric cables, transmission lines, etc.) that can be indicative of the detected properties. The detected signals can be received by a diagnostic system that can process the detection signal and determine whether the sensor is switched-on or switched-off. However, defects in the communication channel (e.g., short circuit, a break in the circuit, etc.) can result in erroneous determination of the state of the sensor. For example, a break in the circuit of the communication channel may appear as a switched-off state of the sensor. It is desirable to distinguish the states of the sensor from the defects in the communication channel. This can allow for fast and efficient identification of defects in the communication channel. Some implementations of the current subject matter can provide for an improved diagnostic system that can identify the states of the sensor from that of the communication channel.

Some implementations of the improved diagnostic system can include a detection circuit that can be coupled to an existing sensor configured to detect properties of the industrial machine. The detection circuit can transmit sensor signals over a communication channel that can be received by an input circuit. The input circuit can generate a signal that can have different properties (e.g., different voltage amplitudes) based on the different states of the sensor and the defects in the communication channel. A diagnostic circuit can receive the signal from the input circuit and identify the states of the sensor and/or the communication channel. In some implementations, the diagnostic circuit can include a digital-to-analog converter (DAC) that can generate a reference signal that can be compared with the signal from the input circuit by a comparator (e.g., an op-amp). Using a DAC can reduce the number of comparators in the detection circuit that can result in an operationally flexible, compact and/or cheap design of the detection circuit.

Figure 1:
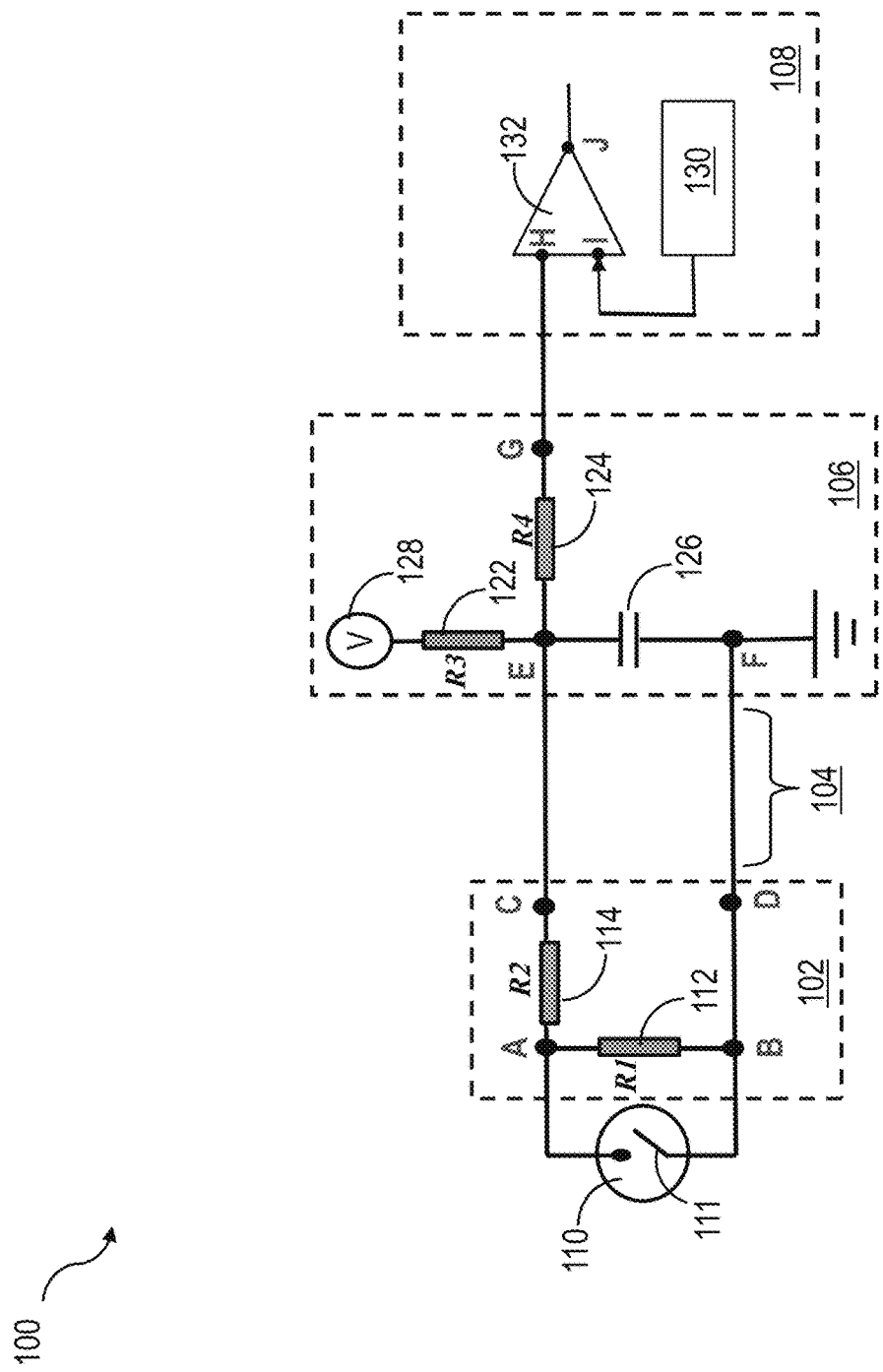
FIG. 1 illustrates a schematic of a first implementation of a diagnostic system.

FIG. 1 illustrates a schematic of an exemplary implementation of a diagnostic system 100 that includes a detection circuit 102, a communication channel 104, an input circuit 106 and a diagnostic circuit 108 that are electrically coupled together. The detection circuit 102 can electrically couple to an input source 110 (e.g., a sensor, a switch, and the like) via a first input pin A and a second input pin B, and to the communication 104 channel via a first output pin C and a second output pin D.

In some implementations, the input source 110 can be a sensor coupled to an industrial machine (not shown). The sensor can detect properties (e.g., vibration, temperature, pressure, etc.) of the industrial machine, and generate a detection signal (e.g., a voltage signal, a current sugnal) indicative of the detected properties. The detection circuit 102 can receive the detection signal via the first input pin A and the second input pin B. For example, detection signal can be represented as a potential difference between the voltages at first input pin A and second input B. The sensor can be switched-on (e.g., for a first time period) and be switched-off (e.g., for a second time period). The sensor can be switched-on for a predetermined period and then switched-off to reduce power consumption by the sensor. Alternately, the sensor may not be functional and appear to be switched-off. In some implementations, a sensor can be represented by a relay (or switch) 111. For example, a closed relay 111 can be representative of a switched-on sensor, and an open relay 111 can be representative of a switched-off sensor (or a defective sensor).

The detection circuit 102 can include a first impedance 112, and a second impedance 114. The first impedance 112 can be configured to couple (e.g., electrical coupling, physical contact, etc.) to the first input pin A (at a first end of the second impedance 112) and couple to the second input pin B and second output pin D at a second end of the first impedance 112. The first impedance 112 can establish an electrical connection between the first input pin A and the second input pin B/second output pin D.

The second impedance 114 can be configured to couple (e.g., electrical coupling, physical contact, etc.) to the first input pin A (at a first end of the first impedance 114) and to the first output pin C (at the other end of the first impedance 114) as illustrated in FIG. 1. The second impedance 114 can establish an electrical connection between the first input pin A and the first output pin C.

The communication channel 104 can electrically couple the detection circuit 102 with an input circuit 106. The input circuit 106 can include a third input pin E, a fourth input pin F and a third output pin G. The communication channel 104 can electrically couple the first output pin C with the third input pin E, and electrically couple the second output pin D with the fourth input pin F. The communication channel 104 can transmit an output signal (e.g., a voltage signal) from the detection circuit 102 (e.g., representative of the detection signal generated by the input source 110) to the input circuit 106 (e.g., received by the third input pin E and the fourth input pin F).

The input circuit 106 can include a voltage source 128, a third impedance 122 and a fourth impedance 124. The third impedance 122 can be configured to couple (e.g., electrical coupling, physical contact, etc.) to the voltage source 128 (at a first end of the third impedance 122) and to the third input pin E (at the other end of the third impedance 122) as illustrated in FIG. 1. The third impedance 122 can establish an electrical connection between the voltage source 128 and the third input pin E. The fourth impedance 124 can be configured to couple (e.g., electrical coupling, physical contact, etc.) to the third input pin E (at a first end of the fourth impedance 124) and couple with the third output pin G at a second end of the fourth impedance 124. The fourth impedance 124 can establish an electrical connection between the third input pin E and the third output pin G.

The input circuit 106 is configured to generate, via the third output pin G, a voltage signal whose amplitude is based on the state of the input source 110 and/or the state of the communication channel 104. For example, the input source 110 can be switched-on (first state of the input source 110) or switched-off (second state of the input source 110). The switched-on state can be represented by a closed relay, and the switched-off state can be represented by an open relay. Additionally or alternately, the communication channel 104 can be in a first state indicative of an extraneous electrical coupling between impedances in the communication channel 104. The extraneous coupling can include, for example, a short circuit between a first communication channel impedance (e.g., that can couple first output pin C and third input pin E), and a second communication channel impedance (e.g., that can couple second output pin D and fourth input pin F). In some implementations, the short circuit can establish an electrical connection (e.g., of very low impedance) between pins C and D, and between pins E and F. The communication channel 104 can be in a second state indicative of a disruption in electrical coupling between the detection circuit 102 and the input circuit 106. The disruption can include, for example, a break in electrical coupling (e.g., resulting in an open circuit) between the detection circuit 102 and the input circuit 106. This can result from a physical damage to the communication channel and/or electrical decoupling between the communication channel 104 and the detection circuit 102/input circuit 106.

The amplitude of the voltage signal at the third output pin G can have multiple values based on the states of the input source 110 and the communication channel 104. Based on the value of amplitude of the voltage signal at the third output pin G, the state of the input source 110/communication channel 104 can be identified. In one implementation, the voltage amplitude at the third output pin G can be related to a voltage amplitude at the third input pin E. For example, the voltage amplitudes at the third output pin G and the third input pin E can be similar (e.g., same) value. This can happen when negligible (or no) current is flowing between pin G and pin E (e.g., when pin G is electrically connected to an input of an operational amplifier via pin G). In one implementation, the first impedance 112, the second impedance 114, and the third impedance 122 have the impedance values of R1, R2 and R3, respectively, the voltage source 128 is at a potential $V_S$, and pins B, D and F are at ground potential (e.g., zero volts). Pins E and F are electrically coupled via a capacitor 126. For DC voltages, the capacitor 126 can act as an open circuit.

When the communication channel 104 is in the first state (short circuit between the first and second communication channel impedances 104), the amplitude of the voltage signal can have a first amplitude: $V_{G1}$=0 Volts. The impedance between the third input pin E and the fourth input pin F is negligible (e.g., zero ohms). When the input source 110 is in the first state (switched-on/closed relay), the amplitude of the voltage signal can have a second amplitude:

$$V_{G2} = \frac{R_2}{R_2 + R_3} V_s \text{Volts}.$$

The impedance between the third input pin E and the fourth input pin F is R2 ohms. When the input source 110 is in the second state (switched-off/open relay), the amplitude of the voltage signal can have a third amplitude:

$$V_{G3} = \frac{R_1 + R_2}{R_1 + R_2 + R_3} V_s \text{Volts}$$

The impedance seen by third input pin E and the fourth input pin F is R1+R2 ohms. When the communication channel 104 is in the second state (open circuit between detection circuit 102 and input circuit 106), the amplitude of the voltage signal can have a fourth amplitude: $V_{G4}=V_S$ Volts. The impedance between the third input pin E and the fourth input pin F is extremely high (e.g., infinite). In some implementations, based on the values of R1, R2 and R3: $V_{G1}<V_{G2}<V_{G3}<V_{G4}$.

The input circuit 106 can be electrically coupled to a diagnostic circuit 108 (e.g., via third output pin G). The diagnostic circuit 108 can compare the voltage signal at the third output pin G with a reference signal generated by a digital-to-analog converter (DAC) 130. The comparison between the voltage signal and the reference signal can be done by an operational amplifier (comparator) 132 included in the diagnostic circuit 108. The comparator 132 can include a first comparator input pin H, a second comparator input pin I and an comparator output pin J. The first comparator input pin H is electrically coupled to the third output pin G of the input circuit 106, and the second comparator input pin I is configured to receive the reference signal.

The reference signal can have a first reference amplitude during a first time period, a second reference amplitude during a second time period, and a third reference amplitude during a third time period. As the amplitude of the reference signal changes, an output signal of the comparator 132 can change. For example, the output signal can have one of a first output state (e.g., a lower potential represented by "0") or a second output state (e.g., higher potential represented by "1"). The state of the output signal can be one of the first output state or the second output state, and the states can change as the voltage value of the reference signal changes (e.g., during transition between first/second/third time periods).

In another implementation (non-inverting setup), the state of the output signal is "1" when the amplitude of the voltage signal at the first comparator input pin H (non-inverting input) is greater than the amplitude of the reference signal at the second comparator input pin I (inverting-input). The state of the output signal is "0" when the amplitude of the voltage signal at the first comparator input pin H is less than the amplitude of the reference signal at the second comparator input pin I.

Figure 2:
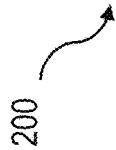
FIG. 2 illustrates exemplary output voltage signals and reference signals that are received by a diagnostic circuit of the diagnostic system.

In one implementation, the amplitude of the reference signal in the first, the second and the third time period can be $V_1$, $V_2$ and $V_3$ (e.g., constant values during the given time period), respectively, wherein: $V_{G1}<V_1<V_{G2}<V_2<V_{G3}<V_3<V_{G4}$. FIG. 2 illustrates exemplary output voltage signals (e.g., voltage signals 212, 214, 216 and 218) and reference signal 210 that are received by the first comparator input pin H and the second comparator input pin I, respectively, of the comparator 132. The reference signal 210 that can have amplitudes $V_1$, $V_2$ and $V_3$ at first, second and third time periods, respectively.

For the first state 202 of the communication channel 104 ("short circuit"), the third output pin G can have a voltage signal 212 (e.g., zero volts) with and amplitude less than $V_1$, $V_2$, and $V_3$ of the reference signal. For example, the voltage signal amplitude can be zero volts. This results in a diagnostic signal comprising a first output signal based on reference signal having amplitude $V_1$ during the first time period, a second output signal corresponding to reference signal having amplitude $V_2$ during the second time period, and a third output signal corresponding to reference signal having amplitude $V_3$ during the third time period. Because the voltage signal 212 has an amplitude less than $V_1$, $V_2$, and $V_3$ at the first, second and third time periods, respectively, the diagnostic signal is in the first output state "0" during the first, the second and the third time periods. This diagnostic signal 222 can be represented by {0, 0, 0}. For the second state 208 of the communication channel 104 ("open circuit"), the third output pin G can have a voltage signal 218 with amplitude ($V_S$) greater than $V_1$, $V_2$, and $V_3$ of the reference signal. For example, the voltage signal amplitude can be $V_{G4}$ Volts. Because the voltage signal 218 has an amplitude greater than $V_1$, $V_2$, and $V_3$ during the first, second and third time periods, respectively, the diagnostic signal is in the second output state "1" during the first, the second and the third time periods. This diagnostic signal 228 can be represented by {1, 1, 1}.

For the first state 204 of the input source 110 ("relay close"), the third output pin G can have a voltage signal 214 with an amplitude less than $V_2$, and $V_3$ but greater than $V_1$ of the reference signal. For example, the voltage signal amplitude can be $V_{G2}$ Volts. Because the voltage signal 214 has an amplitude greater than $V_1$, the diagnostic signal is in the second output state "1" during the first time period. Because the voltage signal 214 has an amplitude less than $V_2$, and $V_3$, the diagnostic signal is in the first output state "0" during the second and third time periods. This diagnostic signal 224 can be represented by {1, 0, 0}.

For the second state 206 of the input source 110 ("relay open"), the third output pin G can have a voltage signal 216 with an amplitude less than $V_3$ but greater than $V_1$ and $V_2$, of the reference signal. or example, the voltage signal amplitude can be $V_{G3}$ Volts. Because the voltage signal 216 has an amplitude greater than $V_1$ and $V_2$, the diagnostic signal is in the second output state "1" during the first and second time periods. Because the voltage signal 216 has an amplitude less than $V_3$, the diagnostic signal is in the first output state "0" during the third time period. This diagnostic signal 226 can be represented by {1, 1, 0}.

The amplitude of the reference signal can be varied (e.g., by a controller, a user, etc.). For example, the reference signal can have an amplitude profile of a series of step functions (e.g., reference signal 210) where the amplitude values $V_1$, $V_2$, and $V_3$ are determined based on characteristic properties of the diagnostic system (e.g., first impedance 112, second impedance 114 and third impedance 122, output voltage of voltage source 128, etc.). For example, the amplitude values $V_1$, $V_2$, and $V_3$ can be set as follows: $V_{G1}<V_1<V_{G2}<V_2<V_{G3}<V_3<V_{G4}$ where $V_{G1}$, $V_{G2}$, $V_{G3}$ and $V_{G4}$ can be determined as described above. After the amplitude profile of the reference signal is determined, the reference signal with the aforementioned amplitude profile can be provided to the second comparator input pin I of the first comparator 132, and the corresponding diagnostic signal can be detected. If the diagnostic signal is {0, 0, 0}, it can be determined that the communication channel is in the first state ("short circuit"). If the diagnostic signal is {1, 1, 1}, it can be determined that the communication channel is in the second state ("open circuit"). If the diagnostic signal is {1, 0, 0}, it can be determined that the input source 110 is in the first state ("relay circuit"). If the diagnostic signal is {1, 0, 0}, it can be determined that the input source 110 is in the first state ("relay close"). If the diagnostic signal is {1, 1, 0}, it can be determined that the input source 110 is in the second state ("relay open").

In another implementation (inverting comparator), the state of the output signal is "0" when the amplitude of the voltage signal at the first comparator input pin H is greater than the amplitude of the reference signal at the second comparator input pin I. The state of the output signal is "1" when the amplitude of the voltage signal at the first comparator input pin H is less than the amplitude of the reference signal at the second comparator input pin I.

Figure 3:
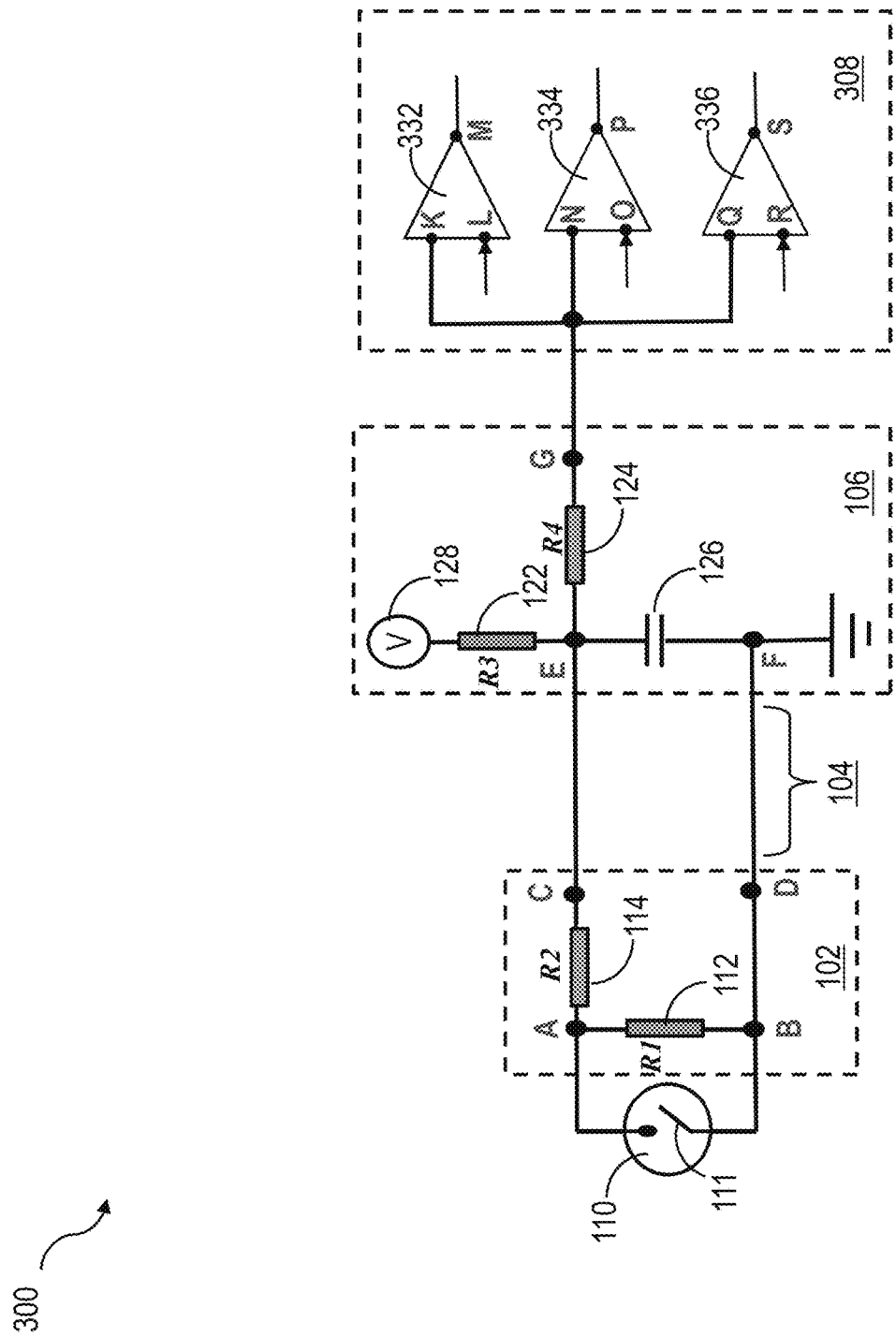
FIG. 3 illustrates a schematic of a second implementation of a diagnostic system.

FIG. 3 illustrates a schematic of a second implementation of a diagnostic system. The diagnostic system 300 includes the detection circuit 102, the communication channel 104, and the input circuit 106 as described before. The diagnostic system 300 includes a second implementation of a diagnostic circuit 308. The diagnostic circuit 308 includes a first comparator 332 comprising a first comparator input pin K, a second comparator input pin L and a first comparator output pin M; includes a second comparator 334 comprising a third comparator input pin N, a fourth comparator input pin O and a second comparator output pin P; and a third comparator 336 comprising a fifth comparator input pin Q, a sixth comparator input pin R and a third comparator output pin S. The first comparator input pin K is electrically coupled to the third output pin G of the input circuit 106, and the second comparator input pin L is configured to receive a first reference signal. The third comparator input pin N is electrically coupled to the third output pin G, and the fourth comparator input pin O is configured to receive a second reference signal. The fifth comparator input pin Q is electrically coupled to the third output pin G, and the sixth comparator input pin R is configured to receive a third reference signal. The first, second and third reference signals can have amplitude values $V_1$, $V_2$, and $V_3$, respectively, that can be set as follows: $V_{G1}<V_1<V_{G2}<V_2<V_{G3}<V_3<V_{G4}$ where $V_{G1}$, $V_{G2}$ and $V_{G3}$ can be determined as described above. Each of the first, second and third reference signals can be generated by separate voltage sources (e.g., three separate voltage sources)

Based on the voltage signal from the third output pin G and the respective reference signals, the first comparator 332 can generate a first output signal via the first comparator output pin M, the second comparator 334 is configured to generate a second output signal via the second comparator output pin P, and the third comparator 336 is configured to generate a third output signal via the third comparator output pin S. The first/second/third output signals can have one of the first output state (e.g., a lower potential represented by "0") or the second output state (e.g., higher potential represented by "1"). A diagnostic signal can include the first output signal, the second output signal, and the third output signal.

For the first state 202 of the communication channel 104 ("short circuit"), the voltage signal amplitude (at the third output pin G and at pins K, N and Q) is less than $V_1$, $V_2$, and $V_3$ of the first, second and third reference signals, respectively (at pins L, O and R, respectively). For example, the voltage signal amplitude can be zero volts. This results in a diagnostic signal wherein the first output signal is in the first output state, the second output signal is in the first output state and the third output signal is in the first output state. This diagnostic signal can be represented by {0, 0, 0}. For the second state 208 of the communication channel 104 ("open circuit"), the voltage signal amplitude (at the third output pin G and at pins K, N and Q) is greater than $V_1$, $V_2$, and $V_3$ of the first, second and third reference signals, respectively (at pins L, 0 and R, respectively). For example, the voltage signal amplitude can be $V_{G4}$ V This will result in a diagnostic signal wherein the first output signal is in the second output state, the second output signal is in the second output state and the third output signal is in the second output state. This diagnostic signal can be represented by {1, 1, 1}.

For the first state 204 of the input source 110 ("relay close"), the voltage signal amplitude (at the third output pin G and at pins K, N and Q) is less than $V_2$ and $V_3$ but greater than $V_1$. For example, the voltage signal amplitude can be $V_{G2}$ Volts. Because the voltage signal has an amplitude greater than $V_1$, the first output signal is in the second output state "1". Because the voltage signal has an amplitude less than $V_2$, and $V_3$, the second output signal and the third output signal are in the first output state "0". This diagnostic signal can be represented by {1, 0, 0}.

For the second state 206 of the input source 110 ("relay open"), the voltage signal amplitude (at the third output pin G and at pins K, N and Q) is less than $V_3$ but greater than $V_1$ and $V_2$. For example, the voltage signal amplitude can be $V_{G3}$ Volts. Because the voltage signal has an amplitude greater than $V_1$ and $V_2$, the first output signal and the second output signals are in the second output state "1". Because the voltage signal has an amplitude less than $V_3$, the third output signal is in the first output state "0". This diagnostic signal can be represented by {1, 1, 0}.

Figure 4:
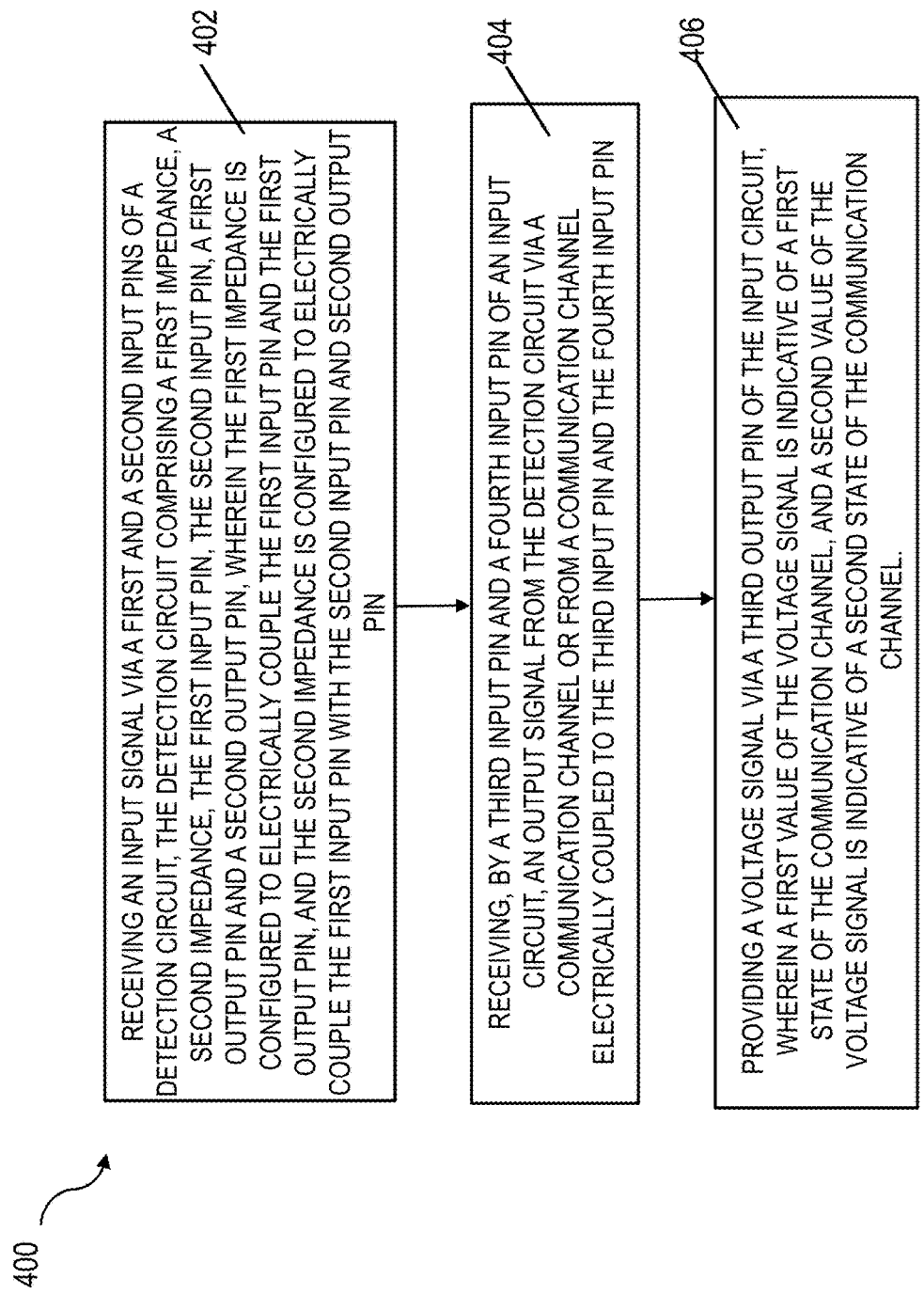
FIG. 4 illustrates a flowchart of an exemplary method of operating the diagnostic system of FIG. 1 or FIG. 3.

FIG. 4 illustrates a flowchart of an exemplary method of operating the diagnostic system of FIG. 1 or FIG. 3.

Approximating language, as used herein throughout the specification and claims, may be applied to modify any quantitative representation that could permissibly vary without resulting in a change in the basic function to which it is related. Accordingly, a value modified by a term or terms, such as "about" and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

What is claimed is:

1. A diagnostic system comprising:
   a detection circuit comprising a first impedance, a second impedance, a first input pin, a second input pin, a first output pin and a second output pin, wherein the detection circuit is configured to receive an input signal via the first and the second input pins,
      wherein the first impedance is configured to electrically couple the first input pin and the first output pin, and the second impedance is configured to electrically couple the first input pin with the second input pin and second output pin;
   a communication channel;
   an input circuit comprising a third input pin, a fourth input pin and a third output pin, wherein the communication channel electrically couples the first output pin with the third input pin, and electrically couples the second output pin with the fourth input pin,
      wherein the input circuit is configured to provide, via the third output pin, a voltage signal, wherein a first value of the voltage signal is indicative of a first state of the communication channel, and a second value of the voltage signal is indicative of a second state of the communication channel.

2. The diagnostic system of claim 1, wherein a third value of the voltage signal is indicative of a first state of an input source and a fourth value of the voltage signal is indicative of a second state of the input source, wherein the input source is configured to electrically couple to the first and the second input pins of the detection system, and generate the input signal.

3. The diagnostic system of claim 2, wherein the input circuit further includes a voltage source, a third impedance and a fourth impedance, wherein the third impedance electrically couples the voltage source with the third input pin, and the fourth impedance electrically couples the third impedance and the third input pin with the third output pin.

4. The diagnostic system of claim 2, further comprising a diagnostic circuit including a first comparator comprising a first comparator input pin, a second comparator input pin and a first comparator output pin, wherein the first comparator input pin is electrically coupled to the third output pin of the input circuit, and wherein the second comparator input pin is configured to receive a first reference signal.

5. The diagnostic system of claim 4, wherein the first reference signal is provided by a digital-to-analog converter (DAC), wherein the first reference signal has a first voltage value during a first time period, a second voltage value during a second time period, and a third voltage value during a third time period.

6. The diagnostic system of claim 5, wherein the first comparator is configured to provide a first output signal during the first time period, a second output signal during a second time period and a third output signal during the third time period, wherein the first, the second and the third output signals have one of a first output state and a second output state, wherein the second output state is at a higher potential than the first output state.

7. The diagnostic system of claim 4, wherein the diagnostic circuit includes a second comparator comprising a third comparator input pin, a fourth comparator input pin and a second comparator output pin, wherein the third comparator input pin is electrically coupled to the third output pin of the input circuit, and wherein the fourth comparator input pin is configured to receive a second reference signal.

8. The diagnostic system of claim 7, wherein the diagnostic circuit includes a third comparator comprising a fifth comparator input pin, a sixth comparator input pin and a third comparator output pin, wherein the fifth comparator input pin is electrically coupled to the third output pin of the input circuit, and wherein the sixth comparator input pin is configured to receive a third reference signal.

9. The diagnostic system of claim 8, wherein the first comparator is configured to provide a first output signal via the first comparator output pin, the second comparator is configured to provide a second output signal via the second comparator output pin, and the third comparator is configured to provide a third output signal via the third comparator output pin.

10. The diagnostic system of claim 9, wherein the first output signal, the second output signal and the third output signal have one of a first output state and a second output state, wherein the second output state is at a higher potential than the first output state.

11. The diagnostic system according to claim 6 or 10, wherein a diagnostic signal includes the first output signal, the second output signal and the third output signal.

12. The diagnostic system of claim 11, wherein the diagnostic signal is indicative of the first state of the communication channel, wherein the first output signal has the first output state, the second output signal has the first output state and the third output signal has the first output state.

13. The diagnostic system of claim 12, wherein the first state of the communication channel is indicative of an extraneous electrical coupling between a first communication channel impedance and a second communication channel impedance in the communication channel.

14. The diagnostic system of claim 11, wherein the diagnostic signal is indicative of the second state of the communication channel, wherein the first output signal has the second output state, the second output signal has the second output state and the third output signal has the second output state.

15. The diagnostic system of claim 14, wherein the second state of the communication channel is indicative of a disruption in electrical coupling between the detection circuit and the input circuit.

16. The diagnostic system of claim 11, wherein the diagnostic signal is indicative of the first state of the input source, wherein the first output signal has the second output state, the second output signal has the first output state and the third output signal has the first output state.

17. The diagnostic system of claim 16, wherein the first state of the input source is indicative that the input source is in a switched-on mode.

18. The diagnostic system of claim 11, wherein the diagnostic signal is indicative of the second state of the input source, wherein the first output signal has the second output state, the second output signal has the second output state and the third output signal has the first output state.

19. The diagnostic system of claim 18, wherein the second state of the input source is indicative that the input source is turned off.

20. A diagnostic system of claim 1, wherein the fourth input pin is electrically coupled to a ground potential, and the third output pin is electrically coupled to the ground potential via a capacitor.

21. A method comprising:
receiving an input signal via a first and a second input pins of a detection circuit, the detection circuit comprising a first impedance, a second impedance, the first input pin, the second input pin, a first output pin and a second output pin,
    wherein the first impedance is configured to electrically couple the first input pin and the first output pin, and the second impedance is configured to electrically couple the first input pin with the second input pin and second output pin;
receiving, by a third input pin and a fourth input pin of an input circuit, an output signal from the detection circuit via a communication channel or from a communication channel electrically coupled to the third input pin and the fourth input pin; and
providing a voltage signal via a third output pin of the input circuit, wherein a first value of the voltage signal is indicative of a first state of the communication channel, and a second value of the voltage signal is indicative of a second state of the communication channel.

\* \* \* \* \*